(12) United States Patent
Kwan et al.

(10) Patent No.: US 7,681,775 B2
(45) Date of Patent: Mar. 23, 2010

(54) MULTI-LAYER THERMAL INSULATION FOR A BONDING SYSTEM

(75) Inventors: Ka Shing Kenny Kwan, Singapore (SG); Man Chan, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 0 days.

(21) Appl. No.: 12/113,499

(22) Filed: May 1, 2008

(65) Prior Publication Data
US 2008/0274325 A1 Nov. 6, 2008

Related U.S. Application Data

(60) Provisional application No. 60/916,016, filed on May 4, 2007.

(51) Int. Cl.
*B23K 37/02* (2006.01)
*G02B 13/00* (2006.01)
(52) U.S. Cl. .................. 228/4.5; 228/904; 359/511; 359/512; 100/323; 100/348

(58) Field of Classification Search .............. 228/4.5, 228/904; 220/592.26; 100/511, 512, 348, 100/323; 156/580–583.9, 285, 286, 379, 156/64; 359/511, 512
See application file for complete search history.

(56) References Cited

U.S. PATENT DOCUMENTS

| | | | |
|---|---|---|---|
| 6,111,599 A * | 8/2000 | Nance et al. .................. 348/82 |
| 6,113,724 A * | 9/2000 | Ogawa ........................ 156/212 |
| 2003/0102811 A1* | 6/2003 | Leone et al. ........... 315/111.51 |

* cited by examiner

*Primary Examiner*—Jessica L Ward
*Assistant Examiner*—Erin B Saad
(74) *Attorney, Agent, or Firm*—Ostrolenk Faber LLP

(57) ABSTRACT

A thermal insulation system is provided for a component of a bonding system, such as an optical system. The thermal insulation system comprises multiple insulation layers located between the component and a heat source. The multiple insulation layers comprise at least one layer of moving air injected into the layer and a cover layer enclosing the layer of moving air. The multiple insulation layers may further comprise a layer of static air.

10 Claims, 4 Drawing Sheets

MULTI-LAYER THERMAL INSULATION FOR A BONDING SYSTEM

CROSS REFERENCE TO RELATED APPLICATION

This application claims the benefit and priority of U.S. Provisional Application Ser. No. 60/916,016 filed May 4, 2007, and entitled MULTI-LAYER THERMAL INSULATION FOR A BONDING SYSTEM, the disclosure of which is incorporated herein by reference.

FIELD OF THE INVENTION

The present invention relates to thermal insulation for a bonding system, such as a wire bonder.

BACKGROUND AND PRIOR ART

Wire bonding is typically applied to make electrical connections between an integrated circuit die or chip and a carrier on which the die is mounted. Bonding wires are attached to bond pads on the chip and bonding leads on the carrier respectively by ultrasonic welding using an ultrasonic transducer which is integrated into a wire bonding apparatus. The ultrasonic transducer is an energy-converting device which converts electrical energy into ultrasonic vibrations and transmits the ultrasonic vibrations to a capillary at a tip end of the transducer to perform wire bonding.

FIG. 1 illustrates a side view of a conventional wire bonding apparatus 10 with a transducer 12 positioned over a bonding area for wire bonding. At one end of the transducer 12 is a capillary 13 for wire bonding. The other end of the transducer 12 is connected to an ultrasonic generator 14 which is housed in a transducer holder 16 mounted on a bond arm 18. The bond arm 18 is connected to a sliding bar 22 at a pivot 20. The sliding bar 22 may move and position the transducer 12 along the x and y axes. The bonding arm 18 is also mounted to a bonding stage 24. The bonding stage 24 moves along the x and y axes together with the sliding bar 22. An optical system 26 is further mounted on the bonding stage 24 such that the optical system 26 moves along the x and y axes together with the sliding bar 22 over a wire bonding platform.

A carrier 28, on which components such as semiconductor dice and bonding wires are attached, is held in position by a window clamp 30 on the wire bonding platform for wire bonding to be performed. The wire bonding platform includes a heater block 32 which provides heat to the carrier 30 to facilitate wire bonding conducted on it.

A camera 27 in the optical system 26 captures an image of a die on the wire bonding platform so that the position of the die on the wire bonding platform can be observed for the purpose of wire bonding. As heat is transmitted to the immediate vicinity of the heater block 32, and the optical system 26 is positioned over the heating zone during wire bonding, the optical system 26 is exposed to heat from the heater block 32 by radiation and by convection. The heat may cause the optical system 26 to expand and increase in length. This changes the distance of a light path to the camera 27 thus affecting the determination of the position of the die on the wire bonding platform. As a result, wire bonding may be inaccurate.

FIG. 2 shows the optical system 26 of FIG. 1 moving away from the heating zone. As a result, the optical system 26 is exposed to less heat from the heating zone. The optical system 26 may then cool and contract, thereby changing the distance of the light path to the camera 27. This again results in inaccurate determination of the position of a die on the wire bonding platform and therefore inaccurate wire bonding.

In view of the above, maintaining the thermal stability of the optical system 26 is essential to perform wire bonding accurately. This is particularly so when very fine wires and bond pitches are involved.

SUMMARY OF THE INVENTION

It is thus an object of the invention to seek to provide thermal protection to a component of the bonding system, such as an optical system, to shield the component from ambient heat and in particular to heat from a heat source such as a heater block.

Accordingly, the invention provides a thermal insulation system for a component of a bonding system, comprising: multiple insulation layers located between the component and a heat source; wherein the multiple insulation layers comprise at least one layer of moving air injected into the layer and a cover layer enclosing the layer of moving air.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of preferred embodiments of the invention when considered with the accompanying drawings, in which.

DETAILED DESCRIPTION OF THE PREFERRED EMBODIMENTS OF THE INVENTION

The preferred embodiments of the present invention will be described hereinafter with reference to the accompanying drawings.

Figure 1:
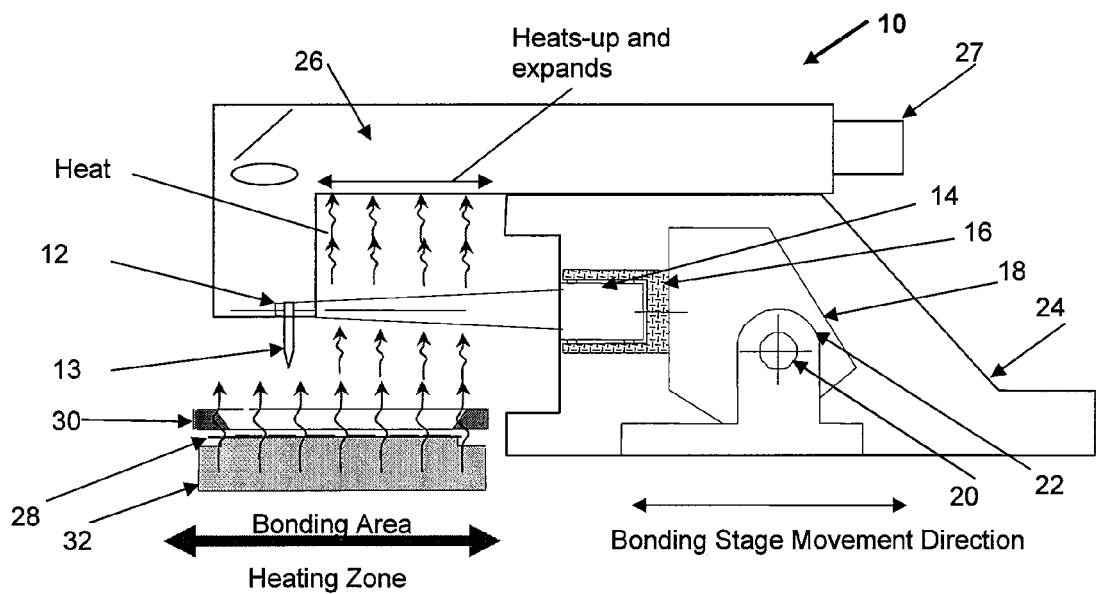
FIG. 1 is a side view of a conventional wire bonding apparatus with an optical system positioned over a bonding area for wire bonding.
Figure 2:
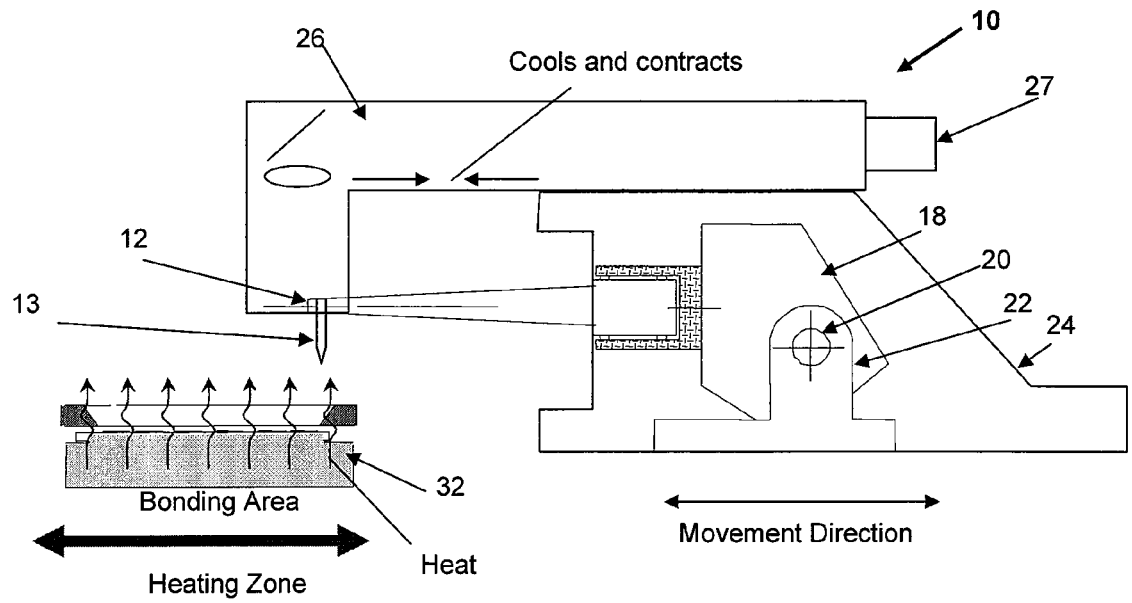
FIG. 2 is a side view of the conventional wire bonding apparatus of FIG. 1 with the optical system positioned further away from the bonding area.
Figure 3:
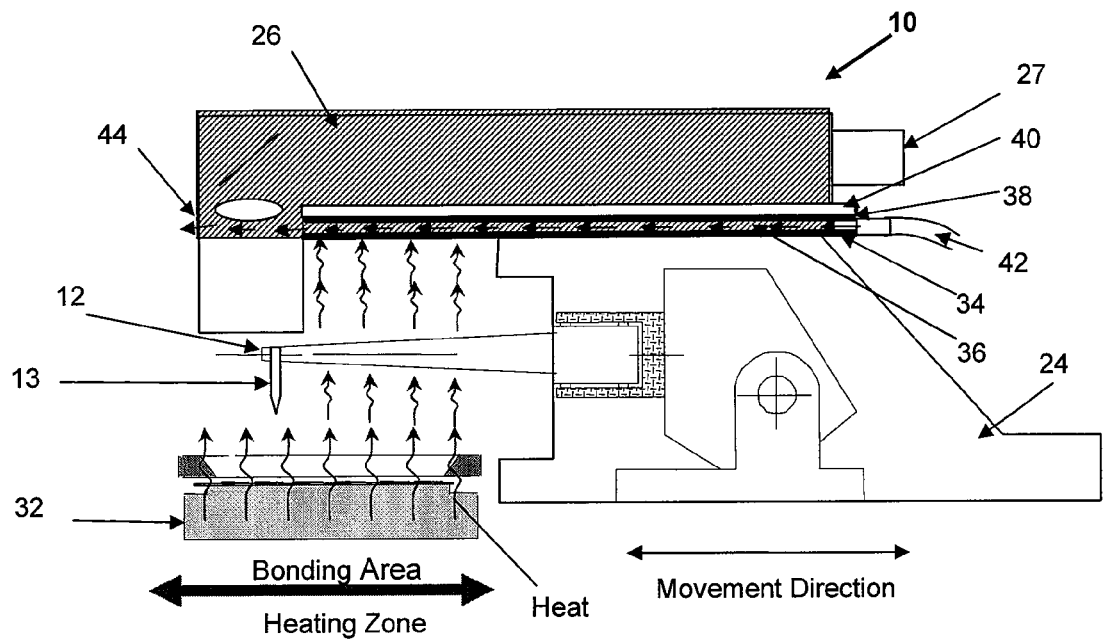
FIG. 3 is a side view of a wire bonding apparatus with an optical system showing a multi-layer thermal insulation system located between the optical system and a heater block according to the preferred embodiment of the invention.

FIG. 3 is a side view of a bonding system in the form of a wire bonder or wire bonding apparatus 10 with a component such as an optical system 26 to be thermally protected, showing a multi-layer thermal insulation system located between the optical system 26 and a heat source such as a heater block 32 according to the preferred embodiment of the invention. The bonding stage 24 moves the optical system 26 over a wire bonding platform. Heat from the heater block 32 radiates upwards towards the transducer 12 and the optical system 26.

The multi-layer thermal insulation system between the optical system 26 and a heater block 32 reduces the amount of heat being transferred from the heater block 32 to the optical system 26. The multi-layer thermal insulation system comprises a cover layer or first thermal insulating layer 34, a dynamic air layer 36 comprising a layer of moving air, a second thermal insulating layer 38 and a static air layer 40. The thermal insulating layers 34, 38 may be made from any insulating material, such as plastic, which provides suitable heat insulation of the optical system 26 from ambient heat during wire bonding. The first thermal insulating layer 34 is located between the dynamic air layer 36 and the static air layer 40 so as to isolate the dynamic air layer 36 and static air layer 40 from the heat from the heater block 32. The second thermal insulating layer 38 isolates the dynamic air layer 36 from the static air layer 40.

Nevertheless, some heat may pass through the thermal insulating layer 34 and enters the dynamic air layer 36. The dynamic air layer 36 serves to remove the heat from the thermal insulation system and insulate the optical system 26. Air enters the dynamic air layer 36 through an air inlet 42 located adjacent to one end of the optical system 26 to supply air to the dynamic air layer 36. The air flows throughout the dynamic air layer 36 below the optical system 26 before flowing out through an outlet 44 located adjacent to an opposite end of the optical system 26 to remove air from the dynamic air layer 36. The moving air helps to dissipate and remove the heat from the heater block 32 that has passed through the first thermal insulating layer 34. The next thermal insulating layer is the second thermal insulating layer 38 which separates the dynamic air layer 36 and the static air layer 40. This layer 38 provides further heat insulation for the optical system 26.

The static air layer 40 is a heat insulating layer immediately next to the optical system 26. The still air allows a temperature equilibrium to be created in this layer which further improves the thermal stability of the optical system 26. The multi-layer thermal insulation system between the optical system 26 and the heater block 32 therefore allows the optical system 26 to achieve thermal stability. Hence, any expansion of the thermally stable optical system 26 due to the heat from the heater block 32 will be minimal and the distance of the light path to the camera 27 remains substantially unchanged during wire bonding, thereby allowing accurate determination of the position of a die on the wire bonding platform. As a result, wire bonding with a high degree of accuracy can be achieved.

Figure 4:
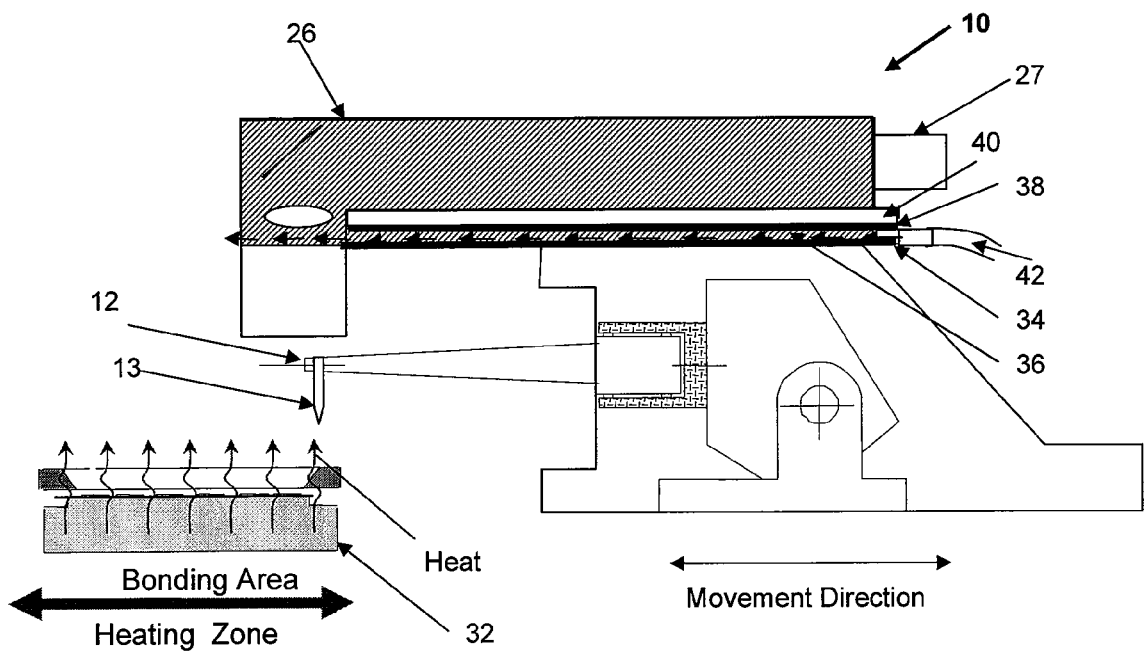
FIG. 4 is a side view of the wire bonding apparatus of FIG. 3 illustrating the optical system and the multi-layer thermal insulation system positioned further away from the bonding area.

FIG. 4 is a side view of the wire bonding apparatus 10 of FIG. 3 illustrating the optical system 26 and the multi-layer thermal insulation system positioned further away from the bonding area. As the optical system 26 is not positioned over the heater block 32, the optical system 26 would start to cool. Contraction of the optical system 26 as a result of such cooling is however substantially prevented as the static air layer 40 of the multi-layer thermal insulation system provides a temperature equilibrium in the immediate layer next to the optical system 26 so that the optical system 26 remains thermally stable.

Figure 5:
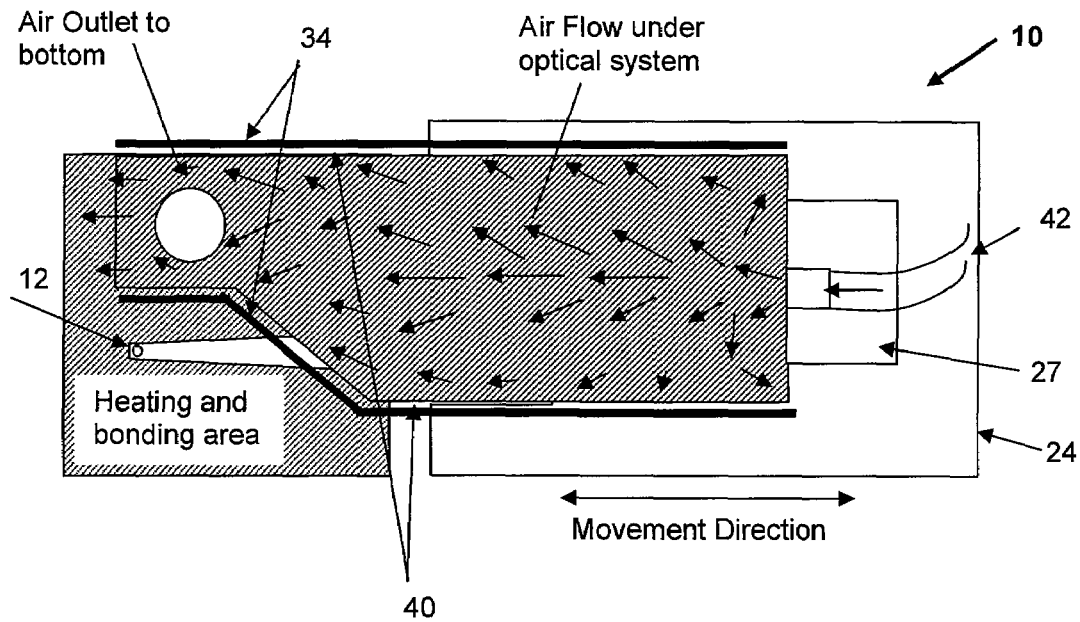
FIG. 5 is a top view of the wire bonding apparatus shown in FIG. 3.

FIG. 5 is a top view of the wire bonding apparatus 10 shown in FIG. 3. This view illustrates air flowing into the dynamic air layer 36 under the optical system 26 via the air inlet 42. The first thermal insulating layer 34 is also located at and extends along both sides of the optical system 26 for surrounding the sides of the optical system 26 and provides heat insulation of the optical system 26 from the surrounding heat. The static air layer 40 is between the first thermal insulating layer 34 and the optical system 26. This static air layer 40 is also located at both sides of the optical system 26 and provides temperature equilibrium to the optical system 26. The second thermal insulating layer 38, which is the insulating layer between the dynamic air layer 36 and the static layer 40, is not shown in this view.

Figure 6:
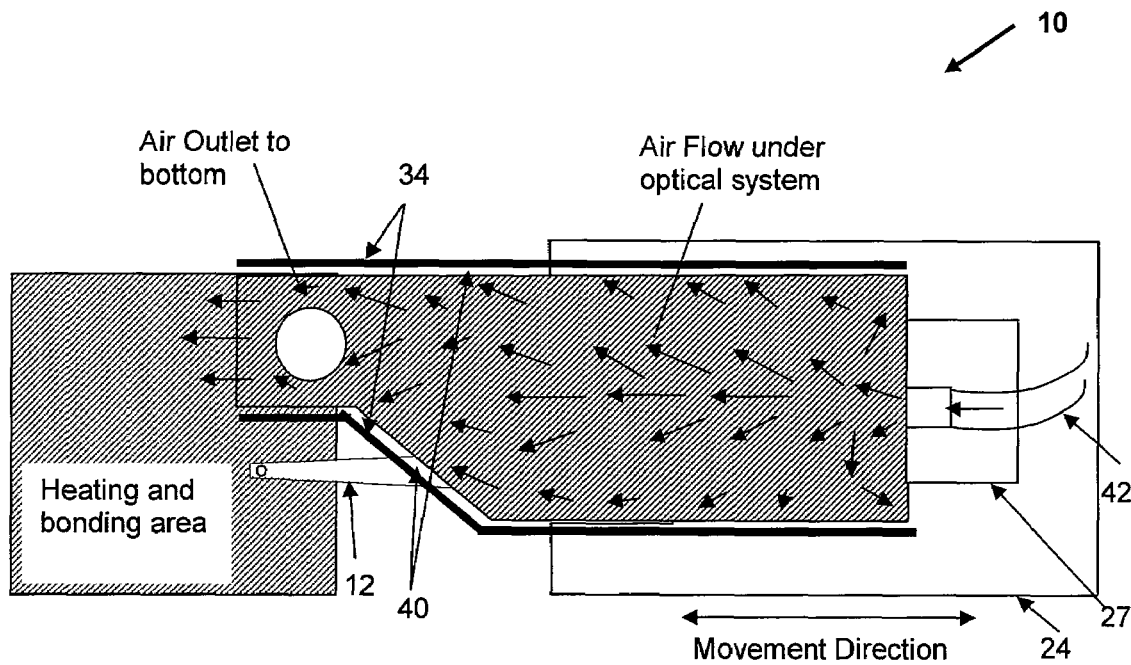
FIG. 6 is a top view of the wire bonding apparatus shown in FIG. 4.

FIG. 6 is a top view of the wire bonding apparatus 10 shown in FIG. 4. The static air layer 40 provides a temperature equilibrium to the optical system 26 so that a drop in temperature of the optical system 26 as a result of the optical system 26 moving away from the heating zone is minimized. The optical system 26 will not substantially cool or contract which would have changed the distance of the light path to the camera 27 thereby affecting the determination of the position of a bonding position on the wire bonding platform. More accurate wire bonding can be achieved as a result.

Figure 7:
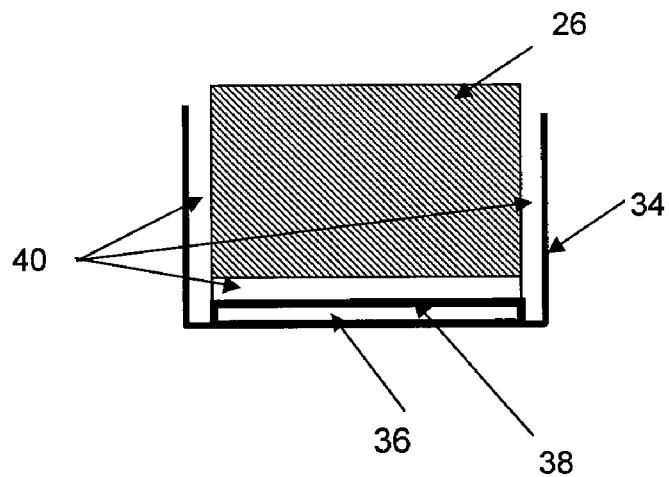
FIG. 7 is a cross-sectional front view of a first preferred embodiment of a multi-layer thermal insulation system covering the optical system.

FIG. 7 is a cross-sectional front view of a first preferred embodiment of a multi-layer thermal insulation system covering the optical system 26. This view shows a static air layer 40 below the optical system 26. The second thermal insulating layer 38 which is the insulating layer between the dynamic air layer 36 and the static layer 40 can be seen in this view.

Figure 8:
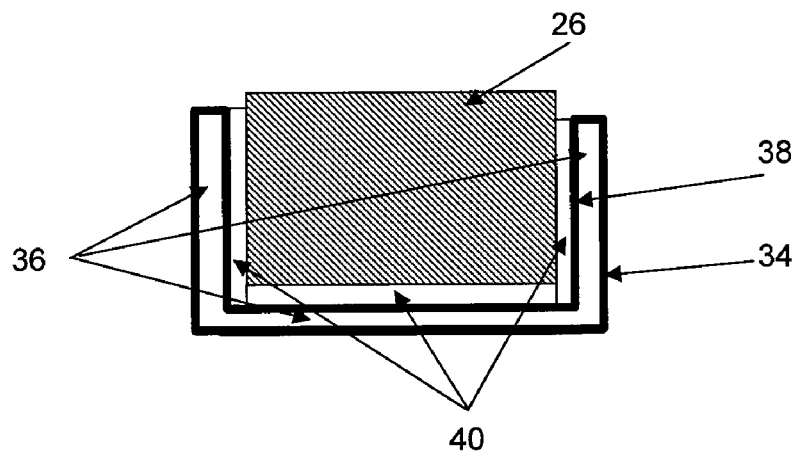
FIG. 8 is a cross-sectional front view of a second preferred embodiment of a multi-layer thermal insulation system covering the optical system.

FIG. 8 is a cross-sectional front view of a second preferred embodiment of a multi-layer thermal insulation system covering the optical system 26. In this view, it can be seen that the second thermal insulating layer 38 extends along and around the sides of the optical system 26 to surround the sides of the optical system 26, as well as at the base of the optical system 26, for providing heat insulation from the surrounding heat. The first and second thermal insulating layers 34, 38 are preferably merged to fully enclose the dynamic air layer 36.

Figure 9:
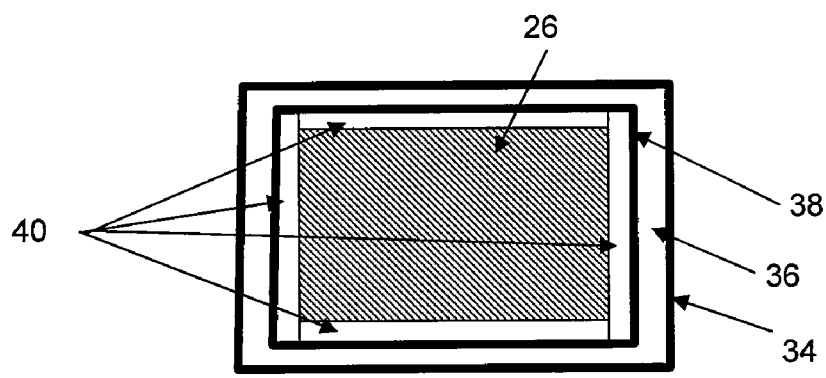
FIG. 9 is a cross-sectional front view of a third preferred embodiment of a multi-layer thermal insulation system covering the optical system.

FIG. 9 is a cross-sectional front view of a third preferred embodiment of a multi-layer thermal insulation system covering the optical system 26. In this view, it can be seen that the multiple thermal insulation layers cover the optical system 26 on all sides to fully enclose the optical system 26. In this embodiment, the optical system 26 is enclosed by four layers of insulation. At the outermost layer, a first thermal insulating layer 34 encloses a dynamic air layer 36. A second thermal insulating layer 38 separates a static air layer 40 from the dynamic air layer 36. This embodiment may provide thermal insulation of the optical system 26 from external heat sources via conduction, convection and radiation.

It should be appreciated that the multi-layer thermal insulation systems in accordance with the preferred embodiments of the invention improve the efficiency of thermal insulation of the optical system 26 to achieve thermal stability. The thermal stability of the optical system 26 leads to an improved accuracy of ball placement at the bonding positions, such as on the bonding pads of the semiconductor dice.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding system comprising:
   an optical component that is operative to observe a position on a device which is being bonded by the bonding system;
   a heat source in the bonding system; and
   multiple insulation layers located between the optical component and the heat source, the multiple insulation layers comprising
      a first isolating layer spaced from the optical component and defining a space between the first isolating layer and the optical component, the first isolating layer and the optical component are configured for containing a layer of static air immediately next to the optical component;
      an air inlet configured and operative to inject a continuous flow of air operative to form a layer of moving air on an opposite side of the first isolating layer from the static layer of air; and
      a cover layer spaced from the first isolating layer and enclosing the layer of moving air between the cover layer and the first isolating layer.

2. A thermal insulation system for an optical component of a bonding system that is operative to observe a position on a device which is being bonded by the bonding system, the thermal insulation system comprising:
   multiple insulation layers located between the optical component and a heat source incorporated in the bonding system, the multiple insulation layers comprising
   a first isolating layer spaced from the optical component and defining a space between the first isolating layer and the optical component, the first isolating layer and the optical component are configured for containing a layer of static air immediately next to the optical component;
   an air inlet configured and operative to inject a continuous flow of air operative to form a layer of moving air on an opposite side of the first isolating layer from the static layer of air; and
   a cover layer spaced from the first isolating layer and enclosing the layer of moving air between the cover layer and the first isolating layer.

3. The thermal insulation system as claimed in claim 2, wherein the cover layer comprises a first thermal insulating layer between the layers of moving and static air on a first side of the first thermal insulating layer and the heat source on an opposite second side of the first thermal insulating layer.

4. The thermal insulation system as claimed in claim 3, wherein the first thermal insulating layer further extends along the sides of the optical component for surrounding the sides of the component and for providing heat insulation from the surrounding heat.

5. The thermal insulation system as claimed in claim 3, wherein the first isolating layer comprises a second thermal insulating layer.

6. The thermal insulation system as claimed in claim 5, wherein the second thermal insulating layer further extends along the sides of the component to surround the sides of the component and for providing heat insulation from the surrounding heat.

7. The thermal insulation system as claimed in claim 5, wherein the first and second thermal insulating layers are merged to fully enclose the layer of moving air.

8. The thermal insulation system as claimed in claim 3, wherein the first thermal insulating layer is made from plastic.

9. The thermal insulation system as claimed in claim 2, wherein the multiple insulation layers are configured to cover the component on all sides of the component to fully enclose the component.

10. The thermal insulation system as claimed in claim 2, wherein the air inlet is located at one end of the layer of moving air to inject air into the layer of moving air, and the thermal insulation system further comprises an air outlet located at an opposite end of the layer of moving air to remove air from the layer.

* * * * *